US012640704B2

(12) United States Patent
Watanabe et al.

(10) Patent No.: US 12,640,704 B2
(45) Date of Patent: May 26, 2026

(54) PIEZOELECTRIC DEVICE

(71) Applicant: Murata Manufacturing Co., Ltd., Nagaokakyo (JP)

(72) Inventors: Munehisa Watanabe, Nagaokakyo (JP); Yasumasa Taniguchi, Nagaokakyo (JP); Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 904 days.

(21) Appl. No.: 17/960,161

(22) Filed: Oct. 5, 2022

(65) Prior Publication Data

US 2023/0027753 A1 Jan. 26, 2023

Related U.S. Application Data

(63) Continuation of application No. PCT/JP2021/014486, filed on Apr. 5, 2021.

(30) Foreign Application Priority Data

Apr. 10, 2020 (JP) ................................. 2020-071025

(51) Int. Cl.
  *H03H 9/02* (2006.01)
  *H03H 9/05* (2006.01)
  (Continued)

(52) U.S. Cl.
  CPC .... *H03H 9/02897* (2013.01); *H03H 9/02866* (2013.01); *H03H 9/059* (2013.01); *H03H 9/1092* (2013.01); *H03H 9/25* (2013.01)

(58) Field of Classification Search
  CPC . H03H 9/02897; H03H 9/02866; H03H 9/059
  (Continued)

(56) References Cited

U.S. PATENT DOCUMENTS

2016/0277003 A1* 9/2016 Kikuchi ............. H03H 9/14541
2018/0091116 A1 3/2018 Kai
(Continued)

FOREIGN PATENT DOCUMENTS

CN 105794108 A 7/2016
JP 2019062350 A 4/2019
(Continued)

OTHER PUBLICATIONS

International Search Report in PCT/JP2021/014486, mailed May 25, 2021, 3 pages.
(Continued)

*Primary Examiner* — Derek J Rosenau
(74) *Attorney, Agent, or Firm* — Keating & Bennett, LLP

(57) ABSTRACT

A piezoelectric device includes a support substrate, an intermediate layer on the support substrate, a piezoelectric layer on the intermediate layer, a functional element on the piezoelectric layer, an insulation layer, and a wiring electrode. The insulation layer is on the support substrate and in contact with the intermediate layer and the piezoelectric layer. The wiring electrode extends from a top of the insulation layer to a top of the piezoelectric layer and is connected to the functional element. The insulation layer includes first and second regions. The first region is thinner than a thickness of the multilayer body. The second region connects the first region and the multilayer body, and includes a portion slanted from the first region toward an upper surface of the piezoelectric layer. The second region of the insulation layer does not extend to the top of the piezoelectric layer.

15 Claims, 3 Drawing Sheets

(51) Int. Cl.
H03H 9/10 (2006.01)
H03H 9/25 (2006.01)

(58) Field of Classification Search
USPC ...... 310/313 R, 313 A, 313 B, 313 C, 313 D
See application file for complete search history.

(56) References Cited

U.S. PATENT DOCUMENTS

2019/0097599 A1 3/2019 Taniguchi et al.
2019/0305748 A1 10/2019 Yamane et al.

FOREIGN PATENT DOCUMENTS

JP 2019179961 A 10/2019
WO 2015098678 A1 7/2015
WO 2016208427 A1 12/2016

OTHER PUBLICATIONS

Written Opinion in PCT/JP2021/014486, mailed May 25, 2021, 4 pages.
Official Communication issued in corresponding Chinese Patent Application No. 202180023499.6, mailed on Jun. 28, 2025, 5 pages.

\* cited by examiner

PIEZOELECTRIC DEVICE

CROSS REFERENCE TO RELATED APPLICATIONS

This application claims the benefit of priority to Japanese Patent Application No. 2020-071025 filed on Apr. 10, 2020 and is a Continuation Application of PCT Application No. PCT/JP2021/014486 filed on Apr. 5, 2021. The entire contents of each application are hereby incorporated herein by reference.

BACKGROUND OF THE INVENTION

1. Field of the Invention

The present disclosure relates to a piezoelectric device and, more particularly, to a technique for reducing or preventing breakage of a wiring electrode in a piezoelectric device.

2. Description of the Related Art

A piezoelectric device has been known in which a functional element is formed on a piezoelectric thin film. For example, International Publication No. 2016/208427 discloses an acoustic wave device in which a piezoelectric thin film is laminated on a laminated film including a low acoustic velocity film and a high acoustic velocity film and a comb-shaped Interdigital Transducer (IDT) electrode is formed on the piezoelectric thin film.

In the acoustic wave device disclosed in International Publication No. 2016/208427, an insulation layer is formed in a region where the laminated film described above is not formed on a support substrate, and the insulation layer reaches an upper side of the piezoelectric thin film. Further, a wiring electrode is formed on the insulation layer.

In the acoustic wave device (piezoelectric device) disclosed in International Publication No. 2016/208427, the wiring electrode disposed on the insulation layer has a shape tracing a shape of the insulation layer. With this, when, on the support substrate, a height of the insulation layer is different from a height of a piezoelectric thin film, a step difference occurs in the wiring electrode. When the step difference is large, since stress is concentrated on a bent portion of the wiring electrode, there is a possibility that a crack occurs in the bent portion and the wiring electrode is broken.

SUMMARY OF THE INVENTION

Preferred embodiments of the present invention provide piezoelectric devices in each of which breakage of a wiring electrode is reduced or prevented.

A piezoelectric device according to a preferred embodiment of the present invention includes a support substrate, an intermediate layer on the support substrate, a piezoelectric layer on the intermediate layer, a functional element on the piezoelectric layer, an insulation layer, and a wiring electrode. The insulation layer is on the support substrate and in contact with a side surface of a multilayer body including the intermediate layer and the piezoelectric layer. The wiring electrode extends from a top of the insulation layer to a top of the piezoelectric layer and is connected to the functional element. The insulation layer includes a first region and a second region. The first region is thinner than a thickness of the multilayer body. The second region connects the first region and the multilayer body, and includes a portion slanted from the first region toward an upper surface of the piezoelectric layer. The second region of the insulation layer does not extend to the top of the piezoelectric layer.

In the piezoelectric devices according to preferred embodiments of the present invention, the insulation layer in the second region does not extend to the upper surface of the piezoelectric layer of the multilayer body. That is, an end portion of the upper surface of the insulation layer is in contact with a side surface of the multilayer body. Thus, a slant angle of the second region may be made smaller than a case in which the insulation layer extends to the top of the piezoelectric layer. With this structure, a bending angle of the wiring electrode on the insulation layer becomes small, and therefore, breakage of the wiring electrode due to bending is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
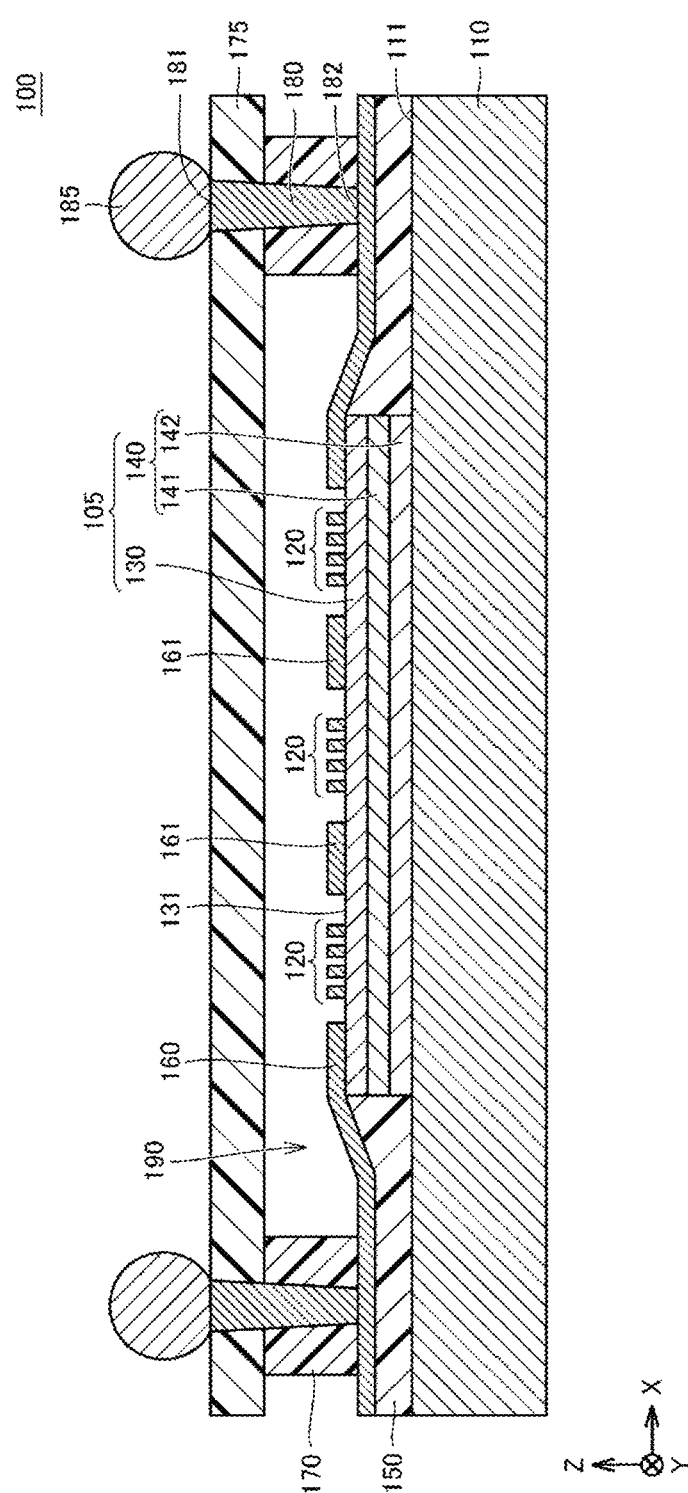
FIG. 1 is a sectional view of a piezoelectric device according to Preferred Embodiment 1 of the present invention.

Hereinafter, preferred embodiments of the present disclosure will be described in detail with reference to the drawings. In the drawings, the same or corresponding portions are denoted by the same reference signs, and description thereof will not be repeated.

Preferred Embodiment 1

Figure 2:
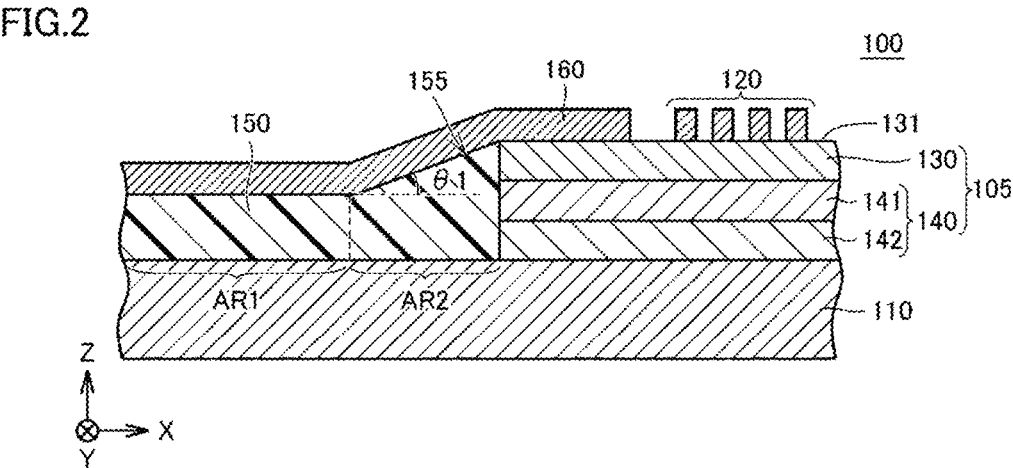
FIG. 2 is a partial sectional view of the piezoelectric device in FIG. 1.

FIG. 1 is a sectional view of a piezoelectric device 100 according to Preferred Embodiment 1 of the present invention. FIG. 2 is an enlarged view of a portion of a section of the piezoelectric device 100 in FIG. 1. With reference to FIG. 1 and FIG. 2, the piezoelectric device 100 includes a support substrate 110, a functional element 120, a piezoelectric layer 130, an intermediate layer 140, an insulation layer 150, and a cover layer 175. In the following description, a positive direction of a Z-axis in each drawing may be referred to as an upper surface side, and a negative direction thereof may be referred to as a lower surface side.

The support substrate 110 is made of: piezoelectric bodies such as lithium tantalate (LiTaO$_3$), lithium niobate (LiNbO$_3$), or quartz; various ceramics such as alumina (Al$_2$O$_3$), magnesia, silicon nitride (SiN), aluminum nitride (AlN), silicon carbide (SiC), zirconia (ZrO$_2$), cordierite, mullite, steatite, or forsterite; dielectrics such as glass;

semiconductors such as silicon (Si), sapphire, or gallium nitride (GaN); or resin substrates, for example.

A multilayer body 105 including the piezoelectric layer 130 and the intermediate layer 140 is provided on a portion of an upper surface 111 of the support substrate 110, and at least one functional element 120 is provided on an upper surface 131 of the piezoelectric layer 130.

The piezoelectric layer 130 is made of: a piezoelectric single crystal material such as lithium tantalate, lithium niobate, zinc oxide (ZnO), aluminum nitride, or lead zirconate titanate (PZT); or piezoelectric multilayer materials thereof, for example.

The functional element 120 includes an acoustic wave resonator including a comb-shaped IDT electrode. A surface acoustic wave (SAW) resonator includes the piezoelectric layer 130 and the functional element 120. The functional element 120 may be made of a metal material such as: a single metal including at least one metal selected from aluminum (Al), copper (Cu), silver (Ag), gold (Au), titanium (Ti), tungsten (W), platinum (Pt), chromium (Cr), nickel (Ni), and molybdenum (Mo); or an alloy including these metals as a main component, for example. Further, the functional element 120 may have a structure in which a plurality of metal films made of these metals or alloys are laminated.

The intermediate layer 140 includes a high acoustic velocity layer 142 disposed on the upper surface 111 of the support substrate 110 and a low acoustic velocity layer 141 disposed on the high acoustic velocity layer 142. The high acoustic velocity layer 142 is configured to propagate a bulk acoustic wave having a velocity higher than a velocity of an acoustic wave propagating through the piezoelectric layer 130. The high acoustic velocity layer 142 may be made of any of: a Diamond-like Carbon (DLC) film; a piezoelectric material such as aluminum nitride, aluminum oxide, silicon carbide, silicon nitride, silicon, sapphire, lithium tantalate, lithium niobate, or quartz; various ceramics such as alumina, zirconia, cordierite, mullite, steatite, or forsterite; magnesia diamond; a material including any of the above materials as a main component; or a material including a mixture of the above materials as a main component, for example.

The low acoustic velocity layer 141 is configured to propagate a bulk acoustic wave having a velocity lower than a velocity of an acoustic wave propagating through the piezoelectric layer 130. The low acoustic velocity layer 141 may be made of any of: silicon oxide, glass, silicon oxynitride, tantalum oxide, a compound obtained by adding fluorine, carbon, or boron to silicon oxide; or a material including any of the above materials as a main component, for example. The acoustic wave excited by the functional element 120 to the piezoelectric layer 130 is reflected with the acoustic velocity difference occurred at a boundary between the low acoustic velocity layer 141 and the high acoustic velocity layer 142, so that the energy of the acoustic wave may effectively be confined in the piezoelectric layer 130.

In the piezoelectric device 100 according to Preferred Embodiment 1, an example has been described in which the intermediate layer 140 includes one low acoustic velocity layer 141 and one high acoustic velocity layer 142, but the intermediate layer 140 may include a plurality of low acoustic velocity layers 141 and a plurality of high acoustic velocity layers 142 that are alternately laminated. Further, an adhesive layer may be provided between the low acoustic velocity layer 141 and the high acoustic velocity layer 142.

On the upper surface 111 of the support substrate 110, the insulation layer 150 is provided in a region where the multilayer body 105 is not provided. The insulation layer 150 is disposed on the support substrate 110 to be in contact with a side surface of the multilayer body 105. Specifically, the insulation layer 150 is disposed to be in contact with, of surfaces of the multilayer body 105, a surface (side surface) connecting a surface (upper surface) on which the functional element 120 is provided and a surface (lower surface) in contact with the support substrate 110. The insulation layer 150 is made of a resin in which a main component is, for example, epoxy, polyimide, acrylic, or urethane.

As illustrated in FIG. 2, the insulation layer 150 includes a first region AR1 that is thinner than the thickness (size in Z-direction) of the multilayer body 105 and a second region AR2 that connects the first region AR1 and the multilayer body 105. An upper surface of the second region AR2 is slanted (slanted portion 155) from the first region AR1 to the upper surface of the multilayer body 105 (that is, the upper surface 131 of the piezoelectric layer 130). An upper end of a contact surface of the insulation layer 150 with the multilayer body 105 is at the same or substantially the same level as the upper surface 131 of the piezoelectric layer 130. That is, the second region AR2 of the insulation layer 150 does not overlap the piezoelectric layer 130 at the surface on which the functional elements are provided.

With reference to FIG. 1, the cover layer 175 is supported by a support layer 170 at a position spaced apart from the functional element 120. The cover layer 175 is made of a resin in which a main component is, for example, epoxy, polyimide, acrylic, or urethane.

The support layer 170 is disposed on an upper surface of the insulation layer 150 to surround a circumference of the multilayer body 105. The support layer 170 is made of a resin including an organic material such as polyimide, an epoxy-based resin, a cyclic olefin-based resin, benzocyclobutene, polybenzoxazole, a phenol-based resin, silicone, or an acrylic resin, for example. A hollow space 190 is provided between the multilayer body 105 and the cover layer 175 with the support layer 170 and the cover layer 175. The functional element 120 is provided inside the hollow space 190.

A columnar electrode 180 penetrates the support layer 170 and the cover layer 175. A first end portion 181 of the columnar electrode 180 on a side of the cover layer 175 is connected to a connection electrode 185 to connect to an external device. A second end portion 182 of the columnar electrode 180 is electrically connected to a wiring electrode 160 provided on the upper surface of the insulation layer 150. The wiring electrode 160 extends from the upper surface of the insulation layer 150 to an upper surface of the piezoelectric layer 130 and is connected to the functional element 120 provided on the piezoelectric layer 130. The functional element 120 and the connection electrode 185 are electrically connected by the wiring electrode 160 and the columnar electrode 180. Further, a wiring electrode 161 is provided on the upper surface 131 of the piezoelectric layer 130. The functional elements 120 are electrically connected to each other with the wiring electrodes 161.

Figure 3:
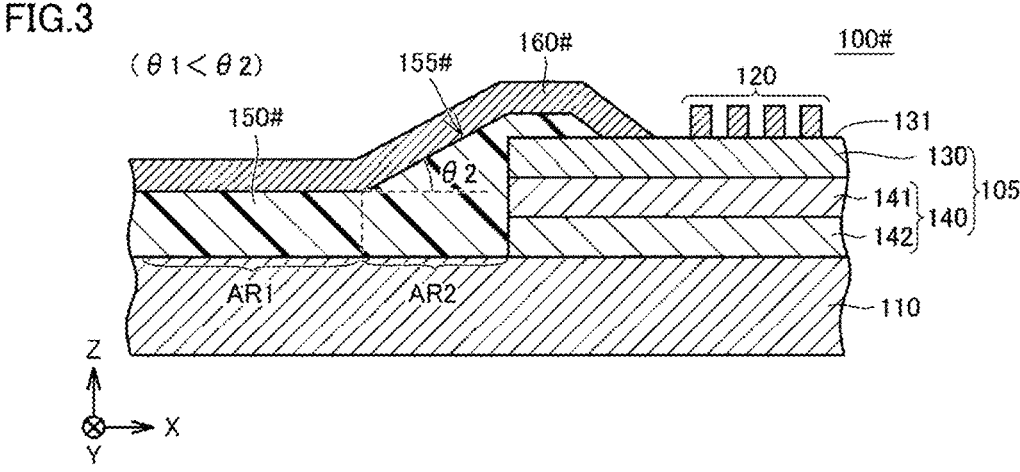
FIG. 3 is a partial sectional view of a piezoelectric device of a comparative example.

FIG. 3 is a partial sectional view of a piezoelectric device 100# of a comparative example. The piezoelectric device 100# is different from the piezoelectric device 100 of Preferred Embodiment 1 in that a portion of an insulation layer 150# extends the upper surface 131 of the piezoelectric layer 130, that is, a second region AR2 of the insulation layer 150# overlaps the piezoelectric layer 130. A wiring electrode 160# extends from an upper surface of the insulation layer 150# to the upper surface of the piezoelectric layer 130.

When distances, in Preferred Embodiment 1 and the comparative example, from a boundary of the first region AR1 and the second region AR2 to the multilayer body are the same or substantially the same, a slant angle $\theta 2$ of a slanted portion 155# in the second region AR2 of the piezoelectric device 100# with respect to an X-axis direction is larger than a slant angle $\theta 1$ of the slanted portion 155 of the piezoelectric device 100 ($\theta 1 < \theta 2$). With this, the bending angle of the wiring electrode 160# in the boundary portion of the first region AR1 and the second region AR2 is also larger in the comparative example. Consequently, since stress is concentrated on the bent portion, there is a possibility that a crack occurs at the bent portion in the wiring electrode 160# and the wiring electrode 160# is broken.

Whereas, in the piezoelectric device 100 of Preferred Embodiment 1, since the slant angle of the slanted portion 155 is smaller than that in the comparative example, stress concentration on the bent portion of the wiring electrode 160 is mitigated in comparison with the case of the comparative example. Accordingly, in the piezoelectric device 100 of Preferred Embodiment 1, the breakage of the wiring electrode 160 due to bending may be reduced or prevented. The slant angle $\theta 1$ of the slanted portion 155 is preferably in a range of, for example, about $0° < \theta 1 < $ about $45°$.

Preferred Embodiment 2

In the piezoelectric device of Preferred Embodiment 1, a side surface of a multilayer body including a piezoelectric layer and an intermediate layer is perpendicular or substantially perpendicular to a support substrate. In Preferred Embodiment 2, a structure will be described in which the side surface of the multilayer body is slanted with respect to the support substrate.

Figure 4:
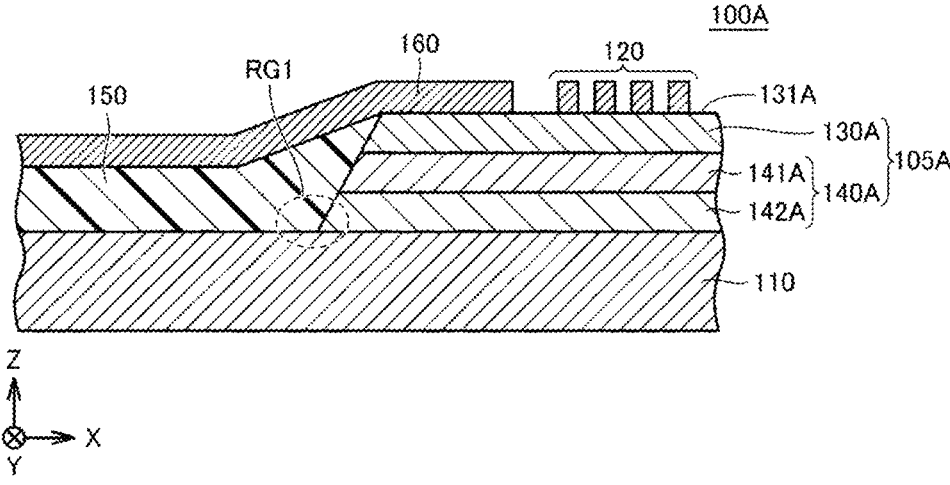
FIG. 4 is a partial sectional view of a piezoelectric device according to Preferred Embodiment 2 of the present invention.

FIG. 4 is a partial sectional view of a piezoelectric device 100A according to Preferred Embodiment 2. The piezoelectric device 100A is configured such that side surfaces, being in contact with the insulation layer 150, of a piezoelectric layer 130A and an intermediate layer 140A (low acoustic velocity layer 141A and high acoustic velocity layer 142A) of a multilayer body 105A are slanted with respect to the support substrate 110. More specifically, the sizes of the piezoelectric layer 130A and the intermediate layer 140A in the X-axis direction and a Y-axis direction increase from an upper surface 131A of the piezoelectric layer 130A toward the support substrate 110. In the insulation layer 150, an upper end of a portion in contact with the multilayer body 105A is at the same or substantially the same level as the upper surface 131A of the piezoelectric layer 130A.

In a piezoelectric device, detachment of an insulation layer from a multilayer body may cause tensile stress to act on a wiring electrode extending from the insulation layer to a piezoelectric layer and may be a primary factor of breakage.

However, configuring a side surface of the multilayer body 105A to be slanted as in the piezoelectric device 100A makes the contact area between the multilayer body 105A and the insulation layer 150 increase, and thus the insulation layer 150 is less likely to be detached from the multilayer body 105A.

Further, in a case that a side surface of a multilayer body is perpendicular or substantially perpendicular to a support substrate, when the insulation layer 150 is provided on the support substrate 110, a portion where the side surface of the multilayer body and the support substrate are in contact with each other (region RG1 in FIG. 4) may insufficiently be filled with an insulation material, and thus air bubbles may remain in some cases. In such a case, there is a possibility that the insulation layer 150 becomes likely to be detached due to weakness of adhesion strength. Whereas, when the side surface of the multilayer body 105A is slanted as in the piezoelectric device 100A of Preferred Embodiment 2, the insulation material easily flows into the portion of the region RG1 and the occurrence of the air bubbles is reduced or prevented. Thus, a decrease in the adhesion strength of the insulation layer 150 may be reduced or prevented.

Accordingly, in the piezoelectric device 100A of Preferred Embodiment 2, the detachment of the insulation layer 150 is reduced or prevented because of the enlargement of the contact area between the insulation layer 150 and the multilayer body 105A and the reduction or prevention of the air bubbles in the insulation material. Consequently, the breakage of the wiring electrode 160 caused by the detachment of the insulation layer 150 may be reduced or prevented.

Preferred Embodiment 3

Some insulation material of an insulation layer have a property of easily absorbing moisture included in a surrounding environment. When such an insulation layer is in contact with a piezoelectric layer, characteristics of the piezoelectric layer may deteriorate by the moisture in the insulation layer, and thus, characteristics of an acoustic wave resonator may deteriorate.

In Preferred Embodiment 3 of the present invention, a configuration will be described in which deterioration in characteristics of an acoustic wave resonator due to moisture absorption of an insulation layer is reduced or prevented by reducing a contact portion between the insulation layer and a piezoelectric layer.

Figure 5:
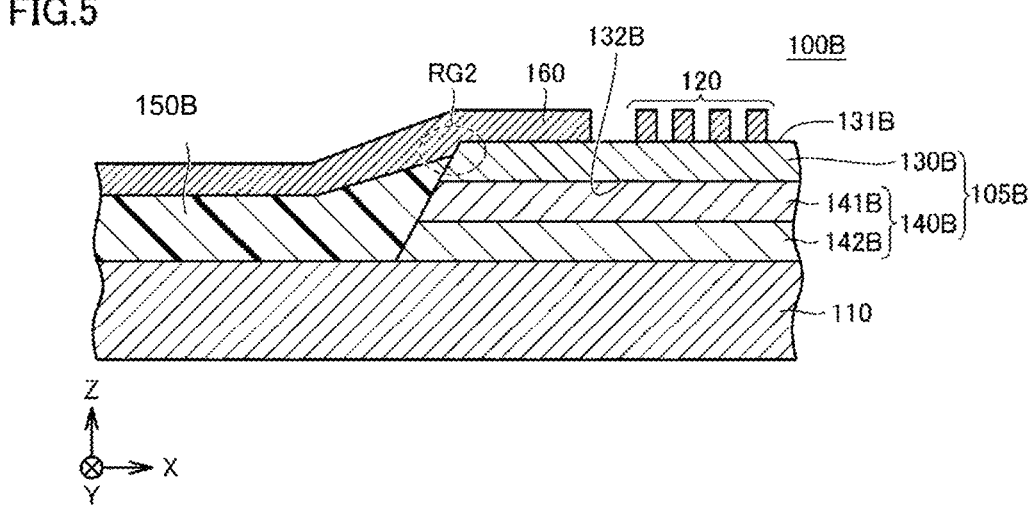
FIG. 5 is a partial sectional view of a piezoelectric device according to Preferred Embodiment 3 of the present invention.

FIG. 5 is a partial sectional view of a piezoelectric device 100B according to Preferred Embodiment 3. The same or substantially the same as the piezoelectric device 100A of Preferred Embodiment 2, the piezoelectric device 100B is configured such that side surfaces, being in contact with an insulation layer 150B, of a piezoelectric layer 130B and an intermediate layer 140B (low acoustic velocity layer 141B and high acoustic velocity layer 142B) of a multilayer body 105B are slanted with respect to the support substrate 110. An upper end of a contact surface of the insulation layer 150B with the multilayer body 105B is in contact with the multilayer body 105B at a position closer than an upper surface 131B of the piezoelectric layer 130B to the support substrate 110. Specifically, as illustrated in a region RG2 in FIG. 5, the upper end of the contact surface of the insulation layer 150B is in contact with the piezoelectric layer 130B between the upper surface 131B and a lower surface 132B of the piezoelectric layer 130B. The distance from the upper surface 131B to the upper end of the contact surface of the insulation layer 150B described above is preferably in a range of, for example, about 10% to about 50% of a thickness (size in Z-axis direction) of the piezoelectric layer 130B.

With the configuration described above, a contact area between an insulation layer and a piezoelectric layer may be reduced, and therefore, even when the insulation layer absorbs moisture, deterioration in characteristics of the piezoelectric layer may be reduced or prevented. Accordingly, deterioration in characteristics of an acoustic wave resonator due to the absorption of moisture in the insulation layer may be reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device, comprising:
a support substrate;
an intermediate layer on the support substrate;
a piezoelectric layer on the intermediate layer;
a functional element on the piezoelectric layer;
an insulation layer on the support substrate and in contact with a side surface of a multilayer body including the intermediate layer and the piezoelectric layer; and
a wiring electrode extending from a top of the insulation layer to a top of the piezoelectric layer and connected to the functional element; wherein
the insulation layer includes:
a first region thinner than a thickness of the multilayer body; and
a second region connecting the first region and the multilayer body and including a portion slanted from the first region toward an upper surface of the piezoelectric layer, and the second region of the insulation layer does not extend to the top of the piezoelectric layer; and
a height of the top of the insulation layer in the second region is the same or substantially the same as a height of the top of the piezoelectric layer.

2. The piezoelectric device according to claim 1, wherein the insulation layer is provided in a region on the support substrate where the multilayer body is not provided.

3. The piezoelectric device according to claim 1, wherein the side surface of the multilayer body is slanted with respect to the support substrate.

4. The piezoelectric device according to claim 1, wherein an upper surface of the insulation layer in the second region is in contact with the multilayer body at a position closer than an upper end of the side surface of the multilayer body to the support substrate.

5. The piezoelectric device according to claim 1, wherein an upper surface of the insulation layer in the second region is in contact with the multilayer body at an upper end of the side surface of the multilayer body.

6. The piezoelectric device according to claim 1, wherein the intermediate layer includes:
a high acoustic velocity layer on the support substrate to propagate a bulk acoustic wave having a velocity higher than a velocity of an acoustic wave propagating through the piezoelectric layer; and
a low acoustic velocity layer between the high acoustic velocity layer and the piezoelectric layer to propagate a bulk acoustic wave having a velocity lower than a velocity of an acoustic wave propagating through the piezoelectric layer.

7. The piezoelectric device according to claim 2, wherein the side surface of the multilayer body is slanted with respect to the support substrate.

8. The piezoelectric device according to claim 2, wherein an upper surface of the insulation layer in the second region is in contact with the multilayer body at a position closer than an upper end of the side surface of the multilayer body to the support substrate.

9. The piezoelectric device according to claim 2, wherein an upper surface of the insulation layer in the second region is in contact with the multilayer body at an upper end of the side surface of the multilayer body.

10. The piezoelectric device according to claim 2, wherein
the intermediate layer includes:
a high acoustic velocity layer on the support substrate to propagate a bulk acoustic wave having a velocity higher than a velocity of an acoustic wave propagating through the piezoelectric layer; and
a low acoustic velocity layer between the high acoustic velocity layer and the piezoelectric layer to propagate a bulk acoustic wave having a velocity lower than a velocity of an acoustic wave propagating through the piezoelectric layer.

11. The piezoelectric device according to claim 3, wherein an upper surface of the insulation layer in the second region is in contact with the multilayer body at a position closer than an upper end of the side surface of the multilayer body to the support substrate.

12. The piezoelectric device according to claim 3, wherein an upper surface of the insulation layer in the second region is in contact with the multilayer body at an upper end of the side surface of the multilayer body.

13. The piezoelectric device according to claim 3, wherein
the intermediate layer includes:
a high acoustic velocity layer on the support substrate to propagate a bulk acoustic wave having a velocity higher than a velocity of an acoustic wave propagating through the piezoelectric layer; and
a low acoustic velocity layer between the high acoustic velocity layer and the piezoelectric layer to propagate a bulk acoustic wave having a velocity lower than a velocity of an acoustic wave propagating through the piezoelectric layer.

14. The piezoelectric device according to claim 4, wherein
the intermediate layer includes:
a high acoustic velocity layer on the support substrate to propagate a bulk acoustic wave having a velocity higher than a velocity of an acoustic wave propagating through the piezoelectric layer; and
a low acoustic velocity layer between the high acoustic velocity layer and the piezoelectric layer to propagate a bulk acoustic wave having a velocity lower than a velocity of an acoustic wave propagating through the piezoelectric layer.

15. The piezoelectric device according to claim 5, wherein
the intermediate layer includes:
a high acoustic velocity layer on the support substrate to propagate a bulk acoustic wave having a velocity higher than a velocity of an acoustic wave propagating through the piezoelectric layer; and
a low acoustic velocity layer between the high acoustic velocity layer and the piezoelectric layer to propagate a bulk acoustic wave having a velocity lower than a velocity of an acoustic wave propagating through the piezoelectric layer.

* * * * *